United States Patent
Jarrett et al.

(10) Patent No.: US 6,167,613 B1
(45) Date of Patent: Jan. 2, 2001

(54) MECHANISM FOR ENGAGING AND DISENGAGING ELECTRICAL CONNECTOR HALVES

(75) Inventors: Brian S. Jarrett, Hillsboro, OR (US); Ronald C. Flamm, Olympia, WA (US); Sanjay Pai, Hillsboro, OR (US); George Daskalakis, Forest Grove, OR (US); Craig Jahne, Beaverton, OR (US); Paul A. Cole, Clackamas, OR (US); Neal E. Broadbent; Stephen R. Brown, both of Portland, OR (US)

(73) Assignee: Intel Corporation, Santa Clara, CA (US)

( * ) Notice: Under 35 U.S.C. 154(b), the term of this patent shall be extended for 0 days.

(21) Appl. No.: 09/179,110

(22) Filed: Oct. 26, 1998

Related U.S. Application Data

(63) Continuation-in-part of application No. 09/002,208, filed on Dec. 31, 1997.

(51) Int. Cl.⁷ ...................................................... B23P 19/00
(52) U.S. Cl. .................................. 29/762; 29/739; 29/764; 29/842
(58) Field of Search .............................. 29/762, 764, 739, 29/842

(56) References Cited

U.S. PATENT DOCUMENTS

| | | | |
|---|---|---|---|
| 3,117,370 | * 1/1964 | Kaupp et al. | 29/762 X |
| 3,457,621 | * 7/1969 | Ebright | 29/764 |
| 3,484,129 | * 12/1969 | Askren | 29/764 X |
| 3,867,753 | * 2/1975 | Urban, II et al. | 29/764 |
| 4,761,144 | 8/1988 | Hunt, III et al. . | |
| 4,783,923 | 11/1988 | Grinwald et al. . | |
| 4,835,844 | 6/1989 | Gerst et al. . | |
| 4,858,309 | * 8/1989 | Korsunsky et al. | 29/764 |
| 5,684,673 | 11/1997 | Shibasaki et al. . | |
| 5,730,630 | 3/1998 | Lacourse et al. . | |

\* cited by examiner

*Primary Examiner*—Carl J. Arbes
(74) *Attorney, Agent, or Firm*—Blakely, Sokoloff, Taylor & Zafman, LLP

(57) ABSTRACT

A device is disclosed herein for engaging and disengaging electrical connector halves, particularly electrical connector halves mounted on printed assembly boards that are to be electrically connected to a back plane. The device provides a drive train mechanism comprised of a plurality of gears and racks that, when attached, act to reduce the insertion force required to make the electrical connector halves disposed on the printed board assemblies and the back plane. A further aspect of the present invention involves the method of attaching a back plane to at least one stationary printed board assembly by actuation of a drive train.

18 Claims, 8 Drawing Sheets

# MECHANISM FOR ENGAGING AND DISENGAGING ELECTRICAL CONNECTOR HALVES

This patent application is a continuation-in-part patent application of U.S. patent application Ser. No. 09/002,208, filed Dec. 31, 1997, now abandoned.

BACKGROUND OF THE INVENTION

1. Field of the Invention

This invention relates generally to mechanical apparatus, and, more particularly, to an apparatus for engaging and disengaging electrical connector components.

2. Description of the Related Art

In the field of manufacturing and assembling printed board assemblies ("PBAs"), various PBAs, such as an input/output board assembly and a CPU board assembly, are inserted into a stationary interconnecting back plane. The individual PBAs and the stationary back plane are connected together by relatively large electrical connectors. One half of the electrical connector is mounted on the individual PBAs and the mating half of the electrical connector is mounted on the stationary interconnecting back plane. Thus, attaching, or inserting, the individual PBAs into the stationary interconnecting back plane requires that the two connector halves be mated together. Such electrical connectors have very high insertion and extraction forces. For example, connectors joining the individual PBAs and the interconnecting back plane may require insertion forces of approximately 43 pounds of force per connector.

Such large insertion forces required for mating the connector halves may lead to several problems. For example, injury to workers may be a concern if the PBAs are inserted into the back plane manually due to these large insertion forces. Another problem that may arise is the potential misalignment of the pins and receptacles of the connector halves that may result in damage to the connector when such large forces are applied to mate the connector halves.

In certain prior art designs, the individual PBAs are movable relative to the stationary interconnecting back plane, i.e., the individual PBAs are inserted into the stationary back plane. In this type of approach, sheet metal trays that allow for the sliding and alignment of the PCBs are required for each PCB. Such a technique adds to the complexity, time and costs of manufacturing the finished product.

The present invention is directed to overcoming or at least reducing the effects of one or more of the problems set forth above.

SUMMARY OF THE INVENTION

In one aspect of the present invention, a device is provided for engaging and disengaging mating electrical connector halves disposed on individual printed board assemblies ("PBAs") and interconnecting back planes. The invention is comprised of a movable panel adapted for forcible engagement with one half of an electrical connector, and a drive train that, when actuated, will urge the electrical connector half into or out of engagement with a corresponding mating connector half. A first portion of the drive train is coupled to the movable panel while a second portion of the drive train is fixed relative to the first portion of the drive train.

In another aspect of the present invention, a method of installing printed circuit board assemblies on a back plane is provided. The method comprises positioning a printed circuit board assembly having one half of an electrical connector coupled thereto adjacent a back plane also having a second electrical connector half mounted thereon. The method further comprises urging the second electrical connector half on the back plane into mated engagement with the electrical connector half on the printed board assembly while the printed board assembly remains stationary. The method also includes positioning the back plane in forcible engagement with a drive train that, when actuated, urges the second electrical connector on the back plane into mated engagement with the electrical connector half coupled to the printed board assembly.

BRIEF DESCRIPTION OF THE DRAWINGS

Other objects and advantages of the invention will become apparent upon reading the following detailed description and upon reference to the drawings in which.

Figure 1:
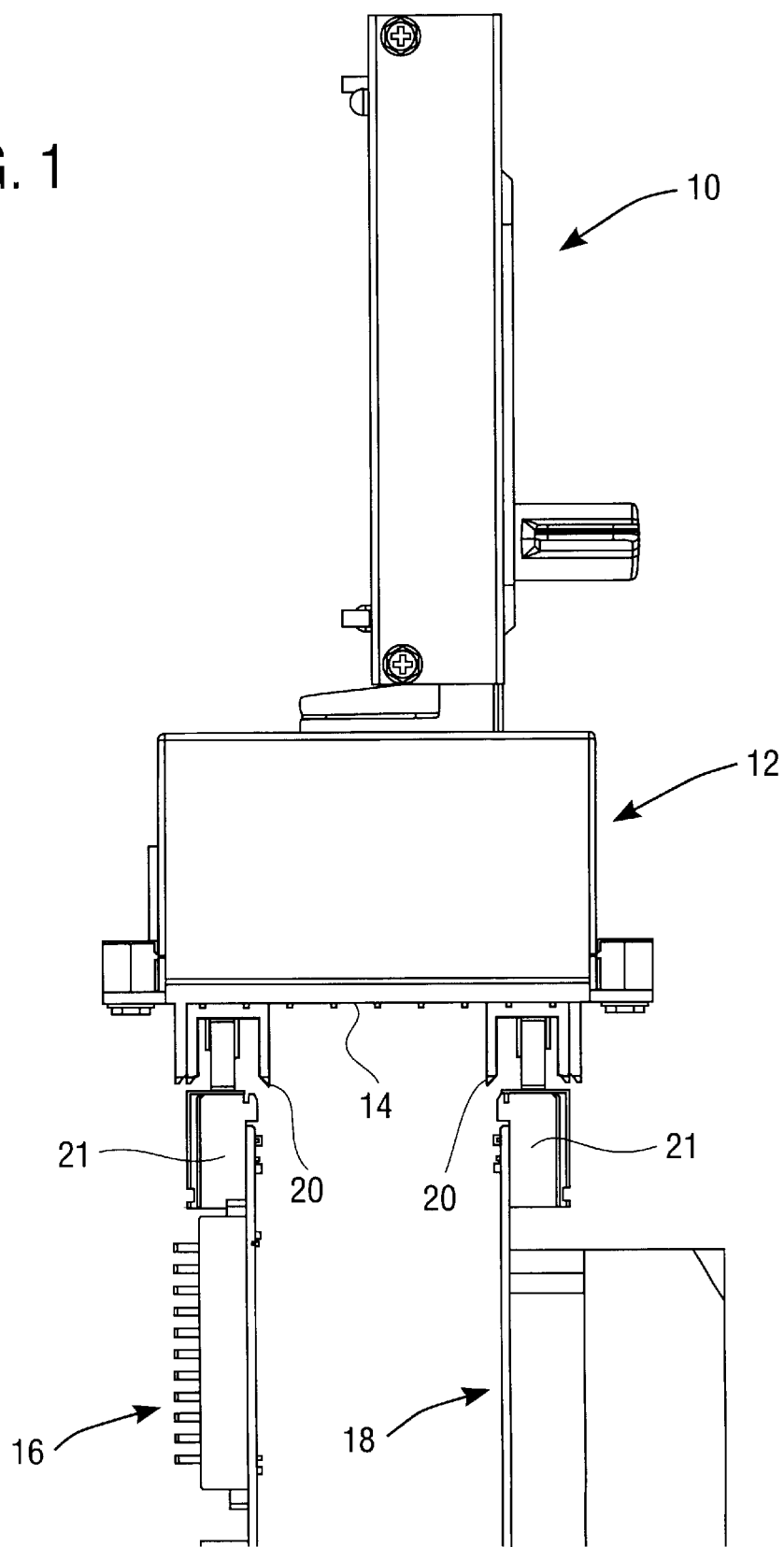
FIG. 1 is a plan view showing the engaging/disengaging mechanism in relation to other components.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Figure 2:
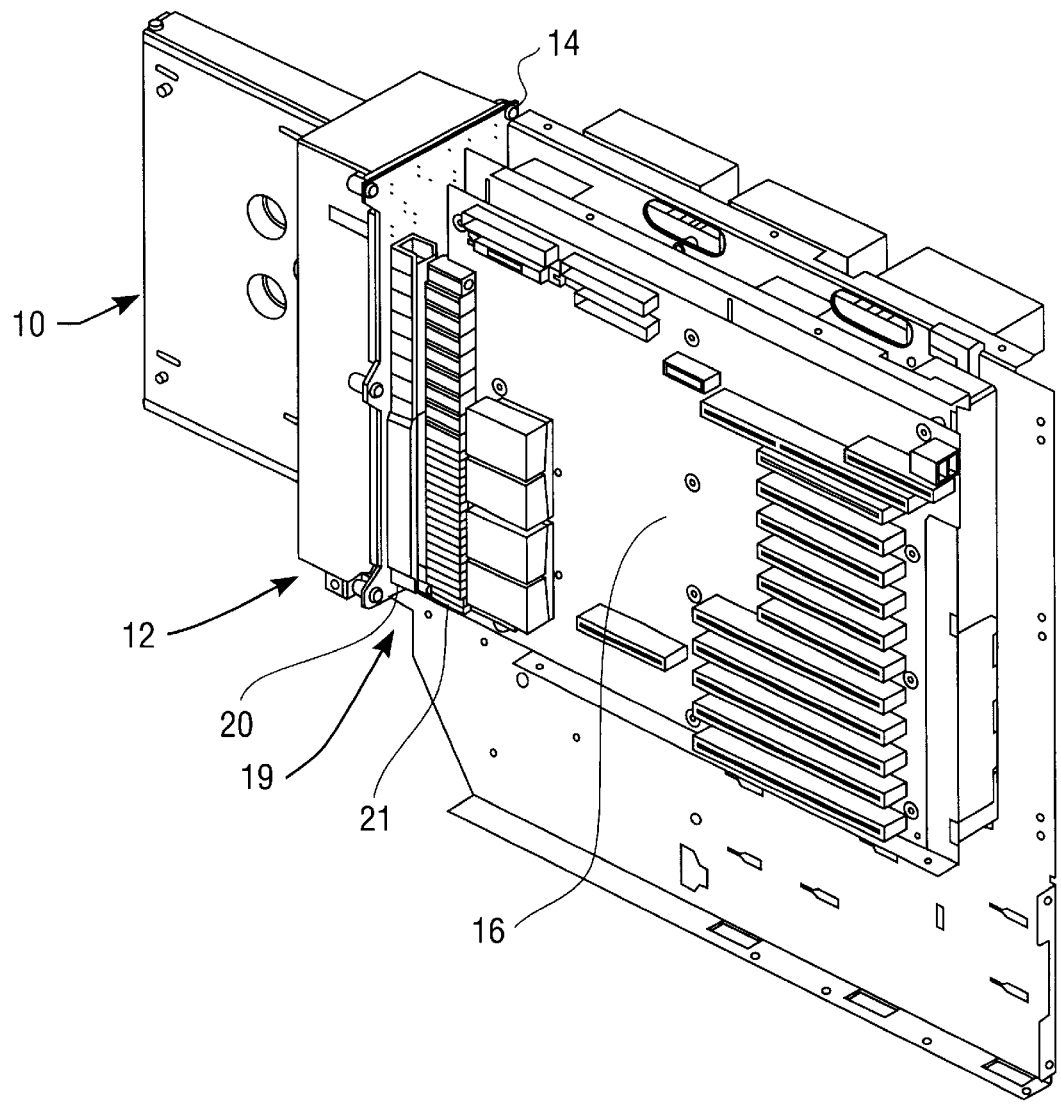
FIG. 2 is an exploded, perspective view of the mechanism of the present invention showing the connector halves in the disengaged position.
Figure 3:
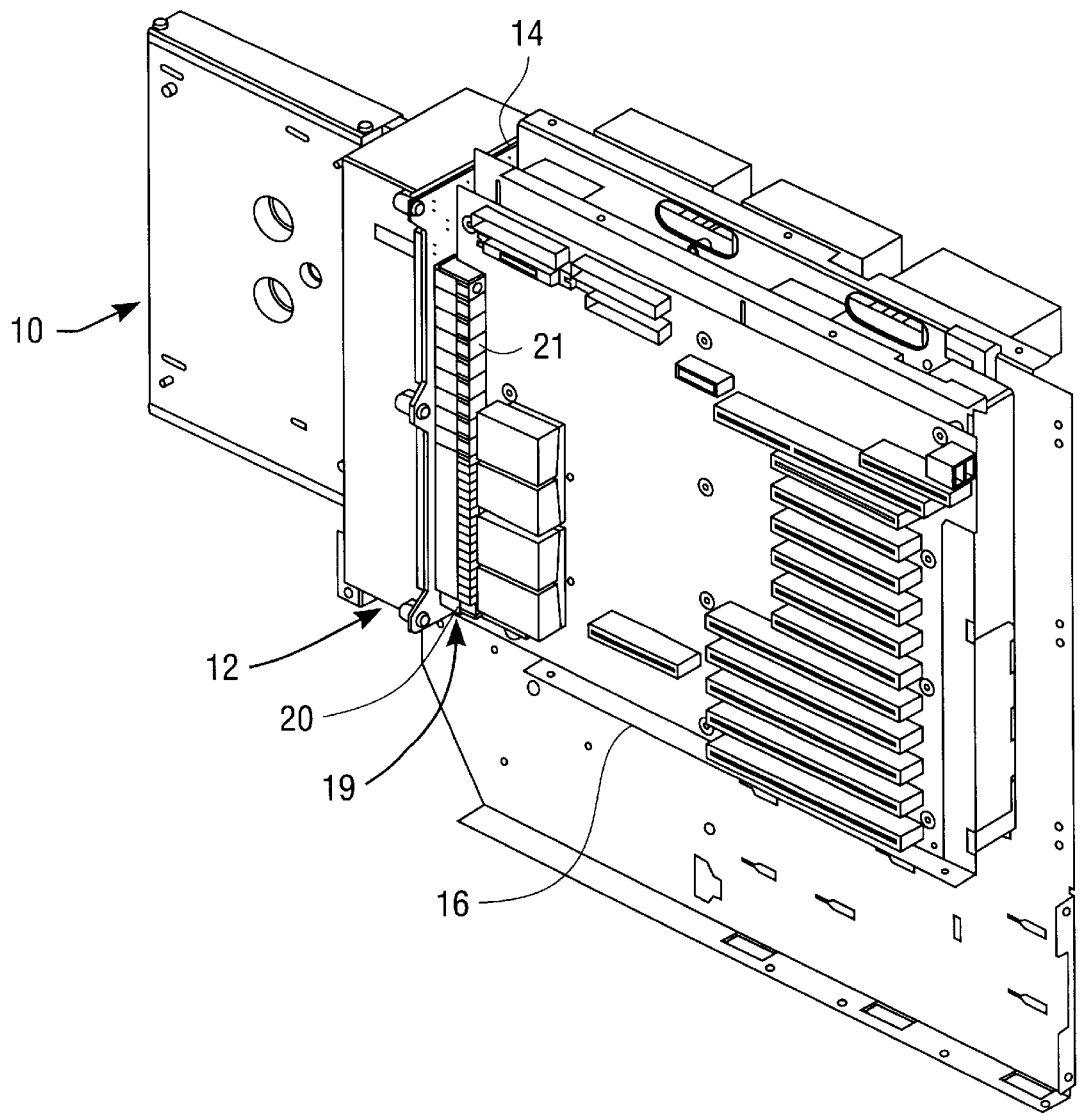
FIG. 3 is a perspective view of the mechanism of the present invention showing the connector halves in the engaged position.

As can be seen from FIG. 1, the engaging/disengaging mechanism 10 is coupled to an alignment assembly 12 having a back plane 14 mounted to it. Two connector halves 20 are shown mounted on the back plane 14. The connector halves 20 are adapted to engage corresponding mating halves of the electrical connector 21 that are mounted on printed board assemblies ("PBA") 16 and 18. FIGS. 2 and 3 are assembly views showing an electrical connector generally designated as 19 in the disengaged (see FIG. 2) and engaged (see FIG. 3) positions. As can be seen in these figures, the connector half 20 is attached to the back plane 14, and connector half 21 is attached to the PBA 16. The stationary panel 22 is mounted internally within a server (not shown).

Figure 4:
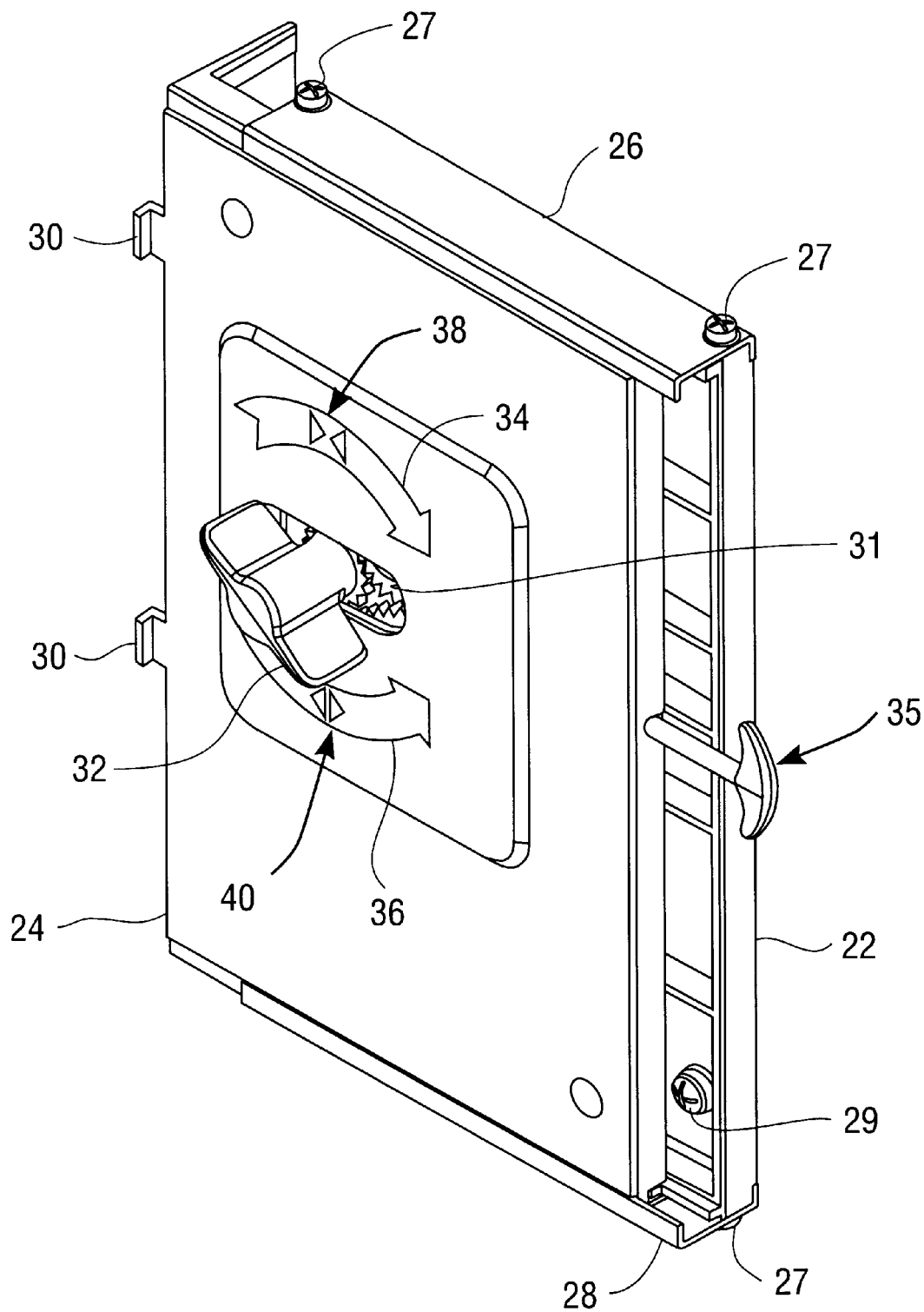
FIG. 4 is a perspective view showing an assembled mechanism of the present invention.
Figure 5:
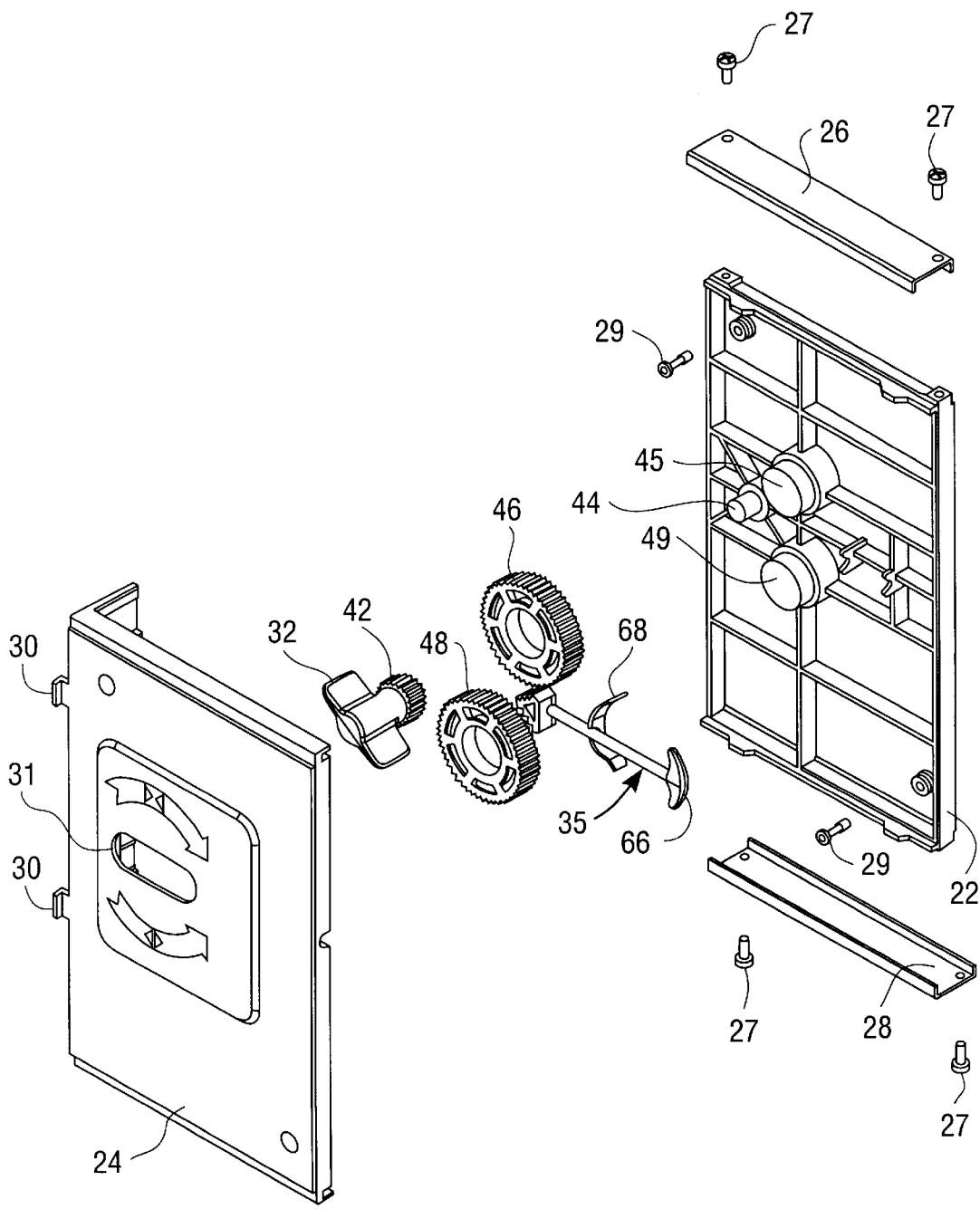
FIG. 5 is an exploded, perspective view of the mechanism of the present invention.

FIGS. 4 and 5 are perspective assembly (FIG. 4) and exploded (FIG. 5) views of the engaging/disengaging mechanism 10. The engaging/disengaging mechanism 10 is comprised of stationary panel 22 and a movable panel 24 that are held together by brackets 26, 28. The brackets 26, 28 are attached to the stationary panel 22 with a plurality of bracket screws 27. The stationary panel 22 may be mounted to any object. In one embodiment, a plurality of mounting screws 29 extend through the stationary panel 22 and attach to a server. The movable panel 24 also includes tabs 30 and a slot 31 formed therein through which extends a handle 32. The movable panel 24 also has disposed thereon indicating arrows 34 and 36, as well as connector symbols 38 and 40. Connector symbols 38 and 40 indicate the mated or unmated condition of the connector halves 20, 21 depending upon the direction the handle 32 is rotated. As indicated by the symbol 38, rotation of the handle 32 in the direction of the indicating arrow 34 (clockwise) urges the connector halves 20, 21 into an engaged position, as shown in FIG. 3. As indicated by the symbol 40, rotation of the handle 32 in the direction of the indicating arrow 36 (counter-clockwise) urges the connector halves 20, 21 into a disengaged position, as shown in FIG. 2. A locking mechanism 35 is also shown in FIG. 4.

Figure 6:
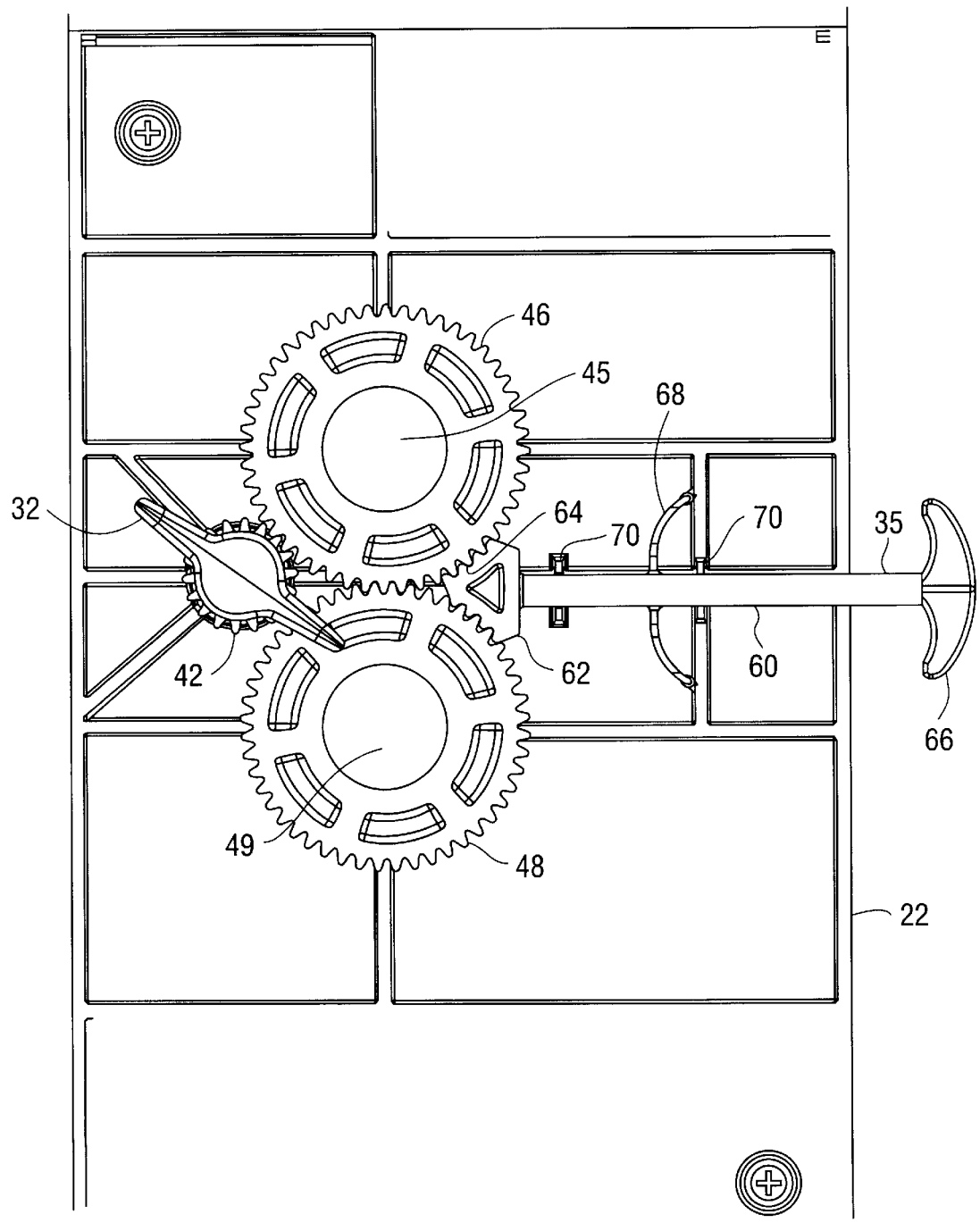
FIG. 6 is a view of a portion of the drive train assembly of the present invention.
Figure 6A:
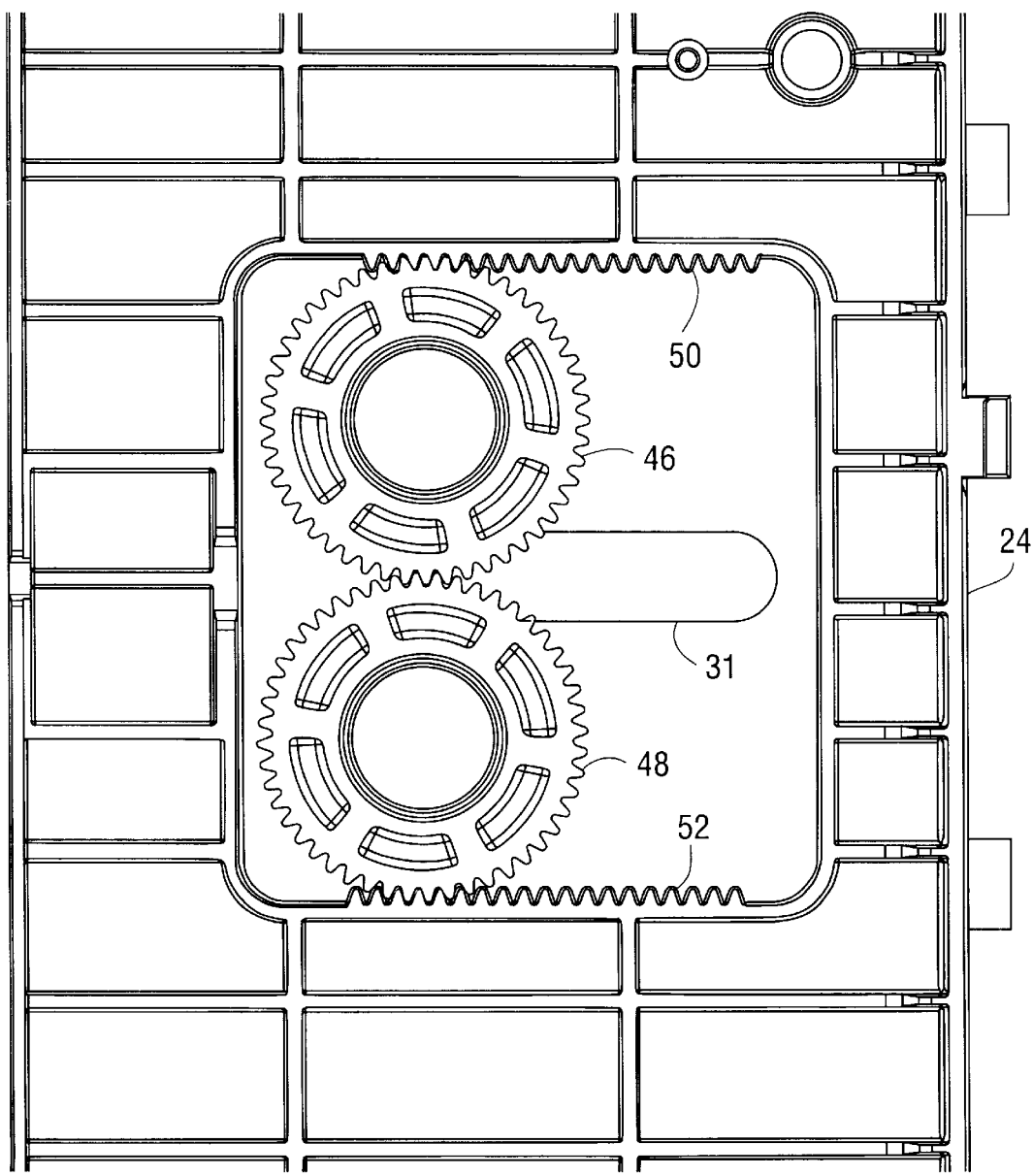
FIG. 6A is a view of a portion of the drive train assembly of the present invention.

Turning now to FIGS. 5, 6 and 6A, the engaging/disengaging mechanism 10 further comprises a drive train 11 disposed between the stationary panel 22 and the movable panel 24. In one embodiment, the drive train 11 is comprised of a first gear 42 fixedly attached to the handle 32, a second gear 46, a third gear 48, a first rack 50, and a second rack 52. Also shown is locking mechanism 35, comprised of body 60, head 62 with gear teeth 64, handle 66, and spring fingers 68. The locking mechanism 35 is mounted in brackets 70 found in the stationary panel 22.

First gear 42 is rotatably coupled to a post 44 on the stationary panel 22, the second gear 46 is rotatably coupled to a post 45 on the stationary panel 22, and the third gear 48 is also rotatably coupled to a post 49 on the stationary panel 22. The first gear 42, second gear 46, and third gear 48 are free to rotate around the respective posts 44, 45, 49 upon which they are mounted. The first gear 42 is engaged with the second gear 46. In turn, the second gear 46 is engaged with the first rack 50 and the third gear 48. The third gear 48 is engaged with the second gear 46 and the second rack 52. The head 62 of locking mechanism 35 engages both second gear 46 and third gear 48. The head 62 of locking mechanism 35 is biased into engagement with second gear 46 and third gear 48 by spring fingers 68. To disengage the head 62 of locking mechanism 35, the handle 66 is pulled away from the second and third gears 46 and 48.

In one embodiment, the first rack 50 and second rack 52 are attached to or integrally formed with the movable panel 24 by any variety of means, including screwing, welding, forming, bolting or any other suitable means. Similarly, the posts 44, 45, 49 upon which the gears 42, 46, 48 are rotatably mounted may be formed integrally with or attached to the stationary panel 22 by any suitable means. Of course, as is readily apparent to those skilled in the art, this arrangement could be reversed, or arranged differently yet still provide the same functional result. Moreover, it is not necessary that there need be a separate stationary panel 22. For example, the posts 44, 45, 49 could be integrally formed into or attached to an entirely separate component as long as at least some components of the drive train 11 are fixed and other portions of the drive train 11 are coupled to a movable device, such as the movable panel 24, so that upon actuation of the drive train 11, the movable device may move relative to the stationary part of the drive train 11, thereby urging the connector halves 20, 21 into an engaged or disengaged position.

In one embodiment, the first gear 42 is a ¾" diameter 18 tooth gear, the second gear 46 is a 2" diameter 48 tooth gear, the third gear 48 is a 2" diameter 48 tooth gear, the first rack 50 and second rack 52 are each 2.44" long and have 19 teeth at a pitch of 8 teeth per inch. This particular configuration of the drive train 11 components uses gear reduction to provide a mechanical advantage that reduces the force required to engage or disengage the electrical connectors 19. For example, it has been determined that, due to the high insertion forces associated with mating the connector halves 20, 21, a total insertion force of approximately 87 pounds is required to engage the PBAs 16 and 18 (approximately 43 pounds of force each) with the back plane 14. Through use of the present engaging/disengaging mechanism 10, this combined insertion force of approximately 87 pounds is reduced to a calculated 16.5 inch-pounds of torque applied at the handle 32. Of course, other gear ratios may be used depending upon design preference.

As to materials of construction, the gear 42 is made of 10% glass filled polycarbonate; gears 46 and 48 are made of polycarbonate; and racks 50 and 52 are made of 20% glass filled PPO (sold under the brand name Noryl by General Electric). The posts on which gears 42, 46 and 48 rotate are also made from 20% glass filled PPO (Noryl). Of course, different materials of construction may be employed to produce the present invention.

Figure 7:
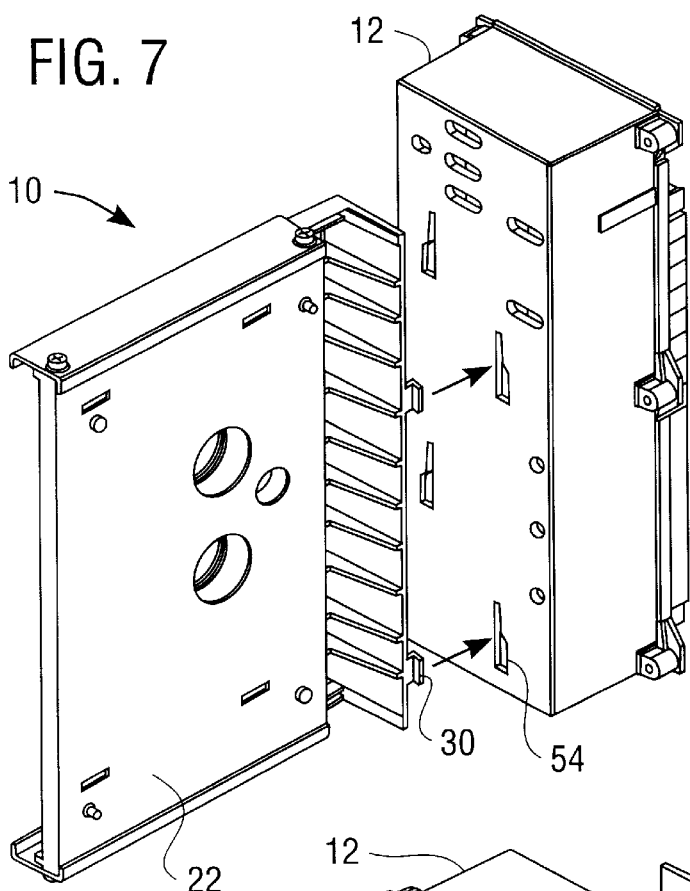
FIG. 7 is a perspective view of the mechanism of the present invention engaging an alignment assembly.
Figure 8:
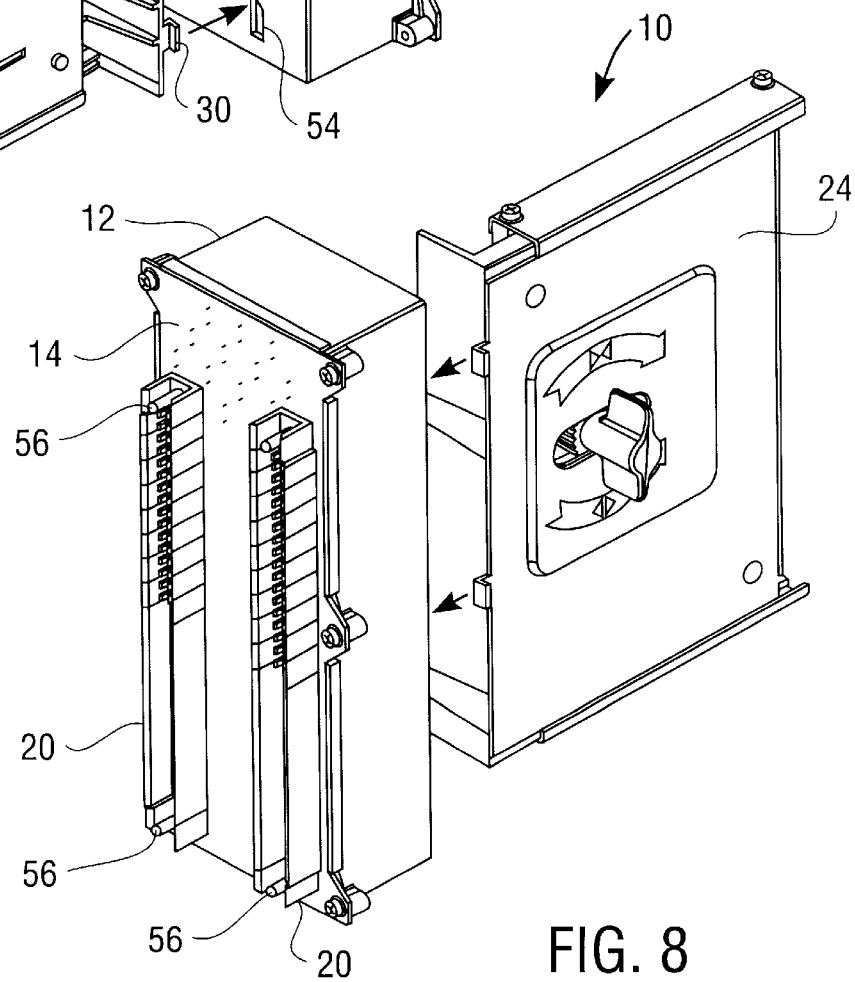
FIG. 8 is another perspective view of the mechanism of the present invention engaging an alignment assembly.

FIGS. 7 and 8 show exploded, perspective views of the interconnection between the engaging/disengaging mechanism 10 and the alignment assembly 12. As shown in these figures, the tabs 30 on the movable panel 24 are inserted into receiving slots 54 in the alignment assembly 12. It should be noted that the receiving slots 54 are elongated in the vertical direction of the assembly so as to accommodate an accumulation of assembly tolerances in that direction. That is, when the connector halves 20, 21 are actually being mated, the receiving slots 54 in the alignment assembly 12 allow the alignment assembly 12 to float in the direction of the elongated portion of the receiving slots 54 as alignment pins 56 of the connector halves 20 engage the corresponding mating connector halves 21 attached to the PBAs 16 and 18 discussed above.

In operation, locking mechanism 35 must first be disengaged from gears 46 and 48. This is accomplished by pulling handle 66 away from the gears 46 and 48. Thereafter, rotation of the handle 32 in a clockwise direction, as indicated by the arrow 34, causes the first gear 42 to rotate clockwise, the second gear 46 to rotate counter-clockwise, and the third gear 48 to rotate clockwise. In turn, the counter-clockwise rotation of the second gear 46 urges the first rack 50, and the movable panel 24 to which the rack 50 is attached, to the left as shown in FIGS. 4 and 6. At the same time, the clockwise rotation of the third gear 48 causes the second rack 52 to likewise be urged in the same direction as the first rack 50, i.e., it causes the movable panel 24 to which the second rack 52 is attached to move to the left as shown in FIGS. 4 and 6. Movement of the movable panel 24 causes the connector halves 20 attached to the back plane 14 to be urged into engagement with the corresponding mating halves 21 of the electrical connectors 19 disposed on the PBAs 16 and 18 as shown in FIG. 1. That is, the movable panel 24 is adapted for forcible engagement, either directly or indirectly, with the back plane 14 and thus the electrical connector halves 20 mounted thereon. During this process, as shown in FIGS. 7 and 8, the tabs 30 on the movable panel 24 are free to move in the elongated portions of the receiving slots 54 on the alignment assembly 12. This freedom of movement accounts for tolerance accumulation in the manufacturing process in the direction of the slots 54.

To disengage the mated connectors 19, the handle 32 is rotated in the counter-clockwise direction as indicated by the arrow 36 in FIG. 4. The counter-clockwise rotation of the handle 32 causes the first gear 42 to rotate counter-clockwise, which in turn causes the second gear 46 to rotate clockwise and the third gear 48 to rotate counter-clockwise. In turn, the clockwise rotation of the second gear 46 and counter-clockwise rotation of the third gear 48 urge the first rack 50, the second rack 52, and the movable panel 24 to which they are attached, to move to the right as shown, in FIGS. 4 and 6.

Of course, as is readily apparent to those skilled in the art, the movable panel 24 could be directly coupled to the back plane 14, i.e., the alignment assembly 12 could be eliminated as a matter of design choice. Similarly, it is also readily apparent that additional components could be installed between the movable panel 24 and the back plane 14. Irrespective of the presence or absence of additional components, the drive train 11 is adapted for forcible engagement with one half of the electrical connector 20, i.e., the present invention acts to urge the electrical connector halves 20 mounted on the back plane 14 into engagement with corresponding mating connector halves mounted on the individual PBAs 16, 18 that are connected to the back plane 14.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A device comprising:
   a movable panel adapted for forcible engagement with a first half of at least one electrical connector; and
   a drive train to urge each first electrical connector half into or out of engagement with a corresponding second electrical connector half, a first portion of said drive train being attached to said movable panel and a second portion of said drive train being fixed relative to said first portion of said drive train,
   wherein said drive train comprises a plurality of rotatably mounted gears and at least one rack.

2. The device of claim 1, wherein each first electrical connector half is coupled to a back plane and each corresponding second electrical connector half is coupled to a printed board assembly.

3. The device of claim 1, comprising a stationary panel to which said second portion of said drive train is coupled.

4. The device of claim 3, wherein said drive train is disposed between said movable panel and said stationary panel.

5. The device of claim 1, comprising a locking mechanism to engage at least one of said plurality of rotatably mounted gears.

6. The device of claim 1, comprising an alignment assembly disposed between said movable panel and each second electrical connector half, said alignment assembly being coupled to said movable panel.

7. The device of claim 6, wherein said movable panel comprises a plurality of tabs to insert into corresponding receiving slots in said alignment assembly.

8. A device comprising:
   a stationary panel;
   a movable panel adapted for forcible engagement with a first half of at least one electrical connector; and
   a drive train connected between said stationary panel and said movable panel, said drive train to urge each first electrical connector half into or out of engagement with a corresponding second electrical connector half.

9. The device of claim 8, wherein each first electrical connector half is coupled to a back plane and each corresponding second electrical connector half is coupled to a printed board assembly.

10. The device of claim 8, wherein said drive train comprises a plurality of rotatably mounted gears and at least one rack.

11. The device of claim 8, wherein said drive train comprises at least one gear coupled to at least one rack.

12. The device of claim 11, comprising a locking mechanism to engage at least one of said at least one gear.

13. The device of claim 8, wherein said drive train comprises at least two gears, each of said gears being coupled to at least one rack.

14. The device of claim 8, wherein said drive train comprises at least three gears, at least two of said gears each being coupled to at least one rack.

15. The device of claim 8, wherein said drive train comprises:
   a first gear;
   a second gear, said second gear engaged with said first gear and a first rack;
   a third gear, said third gear engaged with said second gear and a second rack; and
   a locking mechanism to engage said second and third gears.

16. The device of claim 8, comprising an alignment assembly disposed between said movable panel and each second electrical connector half, said alignment assembly being coupled to said movable panel.

17. The device of claim 16, wherein said movable panel comprises a plurality of tabs to insert into corresponding receiving slots in said alignment assembly.

18. A device comprising:
   a stationary panel;
   a movable panel adapted for forcible engagement with a first half of an electrical connector; and
   means operatively attached to said stationary panel and said movable panel for causing relative movement between said movable panel and said stationary panel, said means to urge said first electrical connector half into or out of engagement with a corresponding second electrical connector half.

* * * * *